US007897444B2

(12) United States Patent
Adam et al.

(10) Patent No.: US 7,897,444 B2
(45) Date of Patent: Mar. 1, 2011

(54) STRAINED SEMICONDUCTOR-ON-INSULATOR (SSOI) BY A SIMOX METHOD

(75) Inventors: Thomas N. Adam, Poughkeepsie, NY (US); Stephen W. Bedell, Wappingers Falls, NY (US); Joel P. de Souza, Putnam Valley, NY (US); Keith E. Fogel, Hopewell Junction, NY (US); Alexander Reznicek, Mount Kisco, NY (US); Devendra K. Sadana, Pleasantville, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 12/363,239

(22) Filed: Jan. 30, 2009

(65) Prior Publication Data

US 2009/0134460 A1    May 28, 2009

Related U.S. Application Data

(62) Division of application No. 11/332,564, filed on Jan. 13, 2006, now Pat. No. 7,485,539.

(51) Int. Cl.
*H01L 21/84* (2006.01)
(52) U.S. Cl. ............... 438/162; 438/480; 257/E21.563
(58) Field of Classification Search .................. 438/480
See application file for complete search history.

(56) References Cited

U.S. PATENT DOCUMENTS

| | | | |
|---|---|---|---|
| 4,962,051 A * | 10/1990 | Liaw | ........................... 438/474 |
| 5,950,094 A | 9/1999 | Lin et al. | |
| 6,326,667 B1 | 12/2001 | Sugiyama et al. | |
| 6,709,909 B2 | 3/2004 | Mizuno et al. | |
| 2003/0003679 A1 | 1/2003 | Doyle et al. | |
| 2003/0119280 A1 | 6/2003 | Lee et al. | |
| 2003/0199126 A1 | 10/2003 | Chu et al. | |
| 2005/0184354 A1 | 8/2005 | Chu et al. | |

FOREIGN PATENT DOCUMENTS

WO    2004/073043    8/2004

OTHER PUBLICATIONS

Mizuno, T. et al. "High Performance Strained-Si p-MOSFETs on SiGe-on-Insulator Substrates Fabricated by SIMOX Technology," IEDM pp. 934-936 (1999).

* cited by examiner

*Primary Examiner*—Chandra Chaudhari
(74) *Attorney, Agent, or Firm*—Scully, Scott, Murphy & Presser, P.C.; Louis J. Percello, Esq.

(57) ABSTRACT

A strained (tensile or compressive) semiconductor-on-insulator material is provided in which a single semiconductor wafer and a separation by ion implantation of oxygen process are used. The separation by ion implantation of oxygen process, which includes oxygen ion implantation and annealing creates, a buried oxide layer within the material that is located beneath the strained semiconductor layer. In some embodiments, a graded semiconductor buffer layer is located beneath the buried oxide layer, while in other a doped semiconductor layer including Si doped with at least one of B or C is located beneath the buried oxide layer.

7 Claims, 6 Drawing Sheets

STRAINED SEMICONDUCTOR-ON-INSULATOR (SSOI) BY A SIMOX METHOD

RELATED APPLICATIONS

This application is a divisional of U.S. application Ser. No. 11/332,564, filed Jan. 13, 2006.

FIELD OF THE INVENTION

The present invention relates to a method of fabricating a semiconductor structure, and more particularly to various methods of fabricating a strained semiconductor-on-insulator (sSOI) material. The present invention also relates to sSOI materials that are fabricated using the methods of the present invention. Both compressive strained and tensile strained materials are provided.

BACKGROUND OF THE INVENTION

Strained semiconductor-on-insulator structures for semiconductor devices combine the benefits of two advanced techniques for performance enhancement, namely, semiconductor-on-insulator (SOI) technology and strained semiconductor technology. On the one hand, a strained SOI configuration offers various advantages associated with the insulating substrate, such as reduced parasitic capacitances and improved isolation. On the other hand, strained semiconductors provide improved carrier mobilities. Devices such as strained semiconductor metal-oxide-semiconductor field-effect transistors (MOSFETs) combine enhanced carrier mobilities with the advantages of insulating substrates.

One method of fabricating strained Si directly on an insulating layer involves using a thick graded SiGe buffer layer, chemical mechanical polishing (CMP), strained Si growth, wafer bonding to a handle wafer including an insulator, layer transfer, and SiGe etch back. Such a prior art method is disclosed, for example, in U.S. Application Publication No. 2003/003679 A1 to Doyle et al. This prior method has an intrinsic complication because wafer bonding requires very smooth surfaces, and graded SiGe films typically have a very rough surface which makes graded SiGe films not suitable for use in most wafer bonding processes. CMP is used in the prior art method to make the surfaces smoother, but CMP reduces the substrate manufacturability, especially for 300 mm wafers.

Moreover, the above method utilizes two expensive material technologies (i) epitaxial growth of a low-defect SiGe buffer layer and a strained Si layer, and (ii) layer transfer of the strain Si onto a handle substrate with an insulator.

Another method of forming strained-Si directly on an insulating layer involves growing a thick, relaxed SiGe layer having a thickness of about 400 nm or greater directly on a SOI wafer. The topmost region of the relaxed SiGe layer is typically designed to have the lowest threading defect density possible (either by step-grading the Ge content or other prior-art methods to reduce the dislocation density). The material below the topmost, relaxed, high-quality SiGe layer is then amorphized by ion-implantation at a dose and energy which reduces or annihilates the crystallinity in the region above the buried oxide layer and below the topmost, relaxed SiGe layer. Subsequent recrystallization annealing would be performed to solid-phase epitaxially regrow the amorphized region of the lattice from the topmost layer downwards. Because the topmost layer is relaxed, high-quality SiGe, recrystallization below this layer would propagate this lattice structure downwards. Therefore, the lowest layer, the original Si layer from the SOI substrate, recrystallizes with the in-plane lattice parameter of the topmost relaxed SiGe layer; and thus be strained in a tensile manner. The SiGe layer can then be selectively removed providing a strained, low-defect density SOI substrate for high-performance CMOS applications.

The main drawbacks to the abovementioned concept are 1) the questionable ability to grow high-quality thick relaxed SiGe alloy layers with low-enough defect density, 2) the questionable ability to recrystallize through a very thick random alloy without generating new defects, 3) the practical challenge of amorphizing such a large buried region with a conventional implant procedure and 4) minimizing the interdiffusion of Ge into the lower Si layer during all these processing steps.

T. Mizuno et al. "High Performance Strained-Si p-MOSFET on SiGe-on-Insulator Substrates Fabricated By SIMOX Technology", International Electron Devices Meeting 1999, Technical Digest, p. 934, December 1999 provide another method of fabricating a sSOI substrate utilizing SIMOX and regrowth of a high-quality strained Si film. In particular, this prior art method begins by first growing a relaxed SiGe layer on a graded SiGe layer. Next, oxygen ions (180 keV, $4 \times 10^{17}$ atoms/cm$^3$) are implanted into the relaxed SiGe layer and thereafter a high temperature anneal (1350° C., 4 hours) is performed to grow a buried oxide within the SiGe layer. After implanting and annealing, a SiGe layer and a thick (20 nm) strained Si layer are regrown on the structure including the buried oxide. Despite being capable of forming an sSOI without wafer bonding or amorphization, this prior art technique requires separate regrowth steps to be performed after the SIMOX process that add additional processing steps and thus manufacturing costs in producing sSOI materials.

In view of the above, there is a need for providing new and improved methods of forming a strained semiconductor-on-insulator (SSOI) material that do not exhibit any of the drawbacks mentioned above. U.S. Ser. No. 10/883,887, filed Jul. 2, 2004 provides one such method of forming sSOI materials that avoids the drawbacks mentioned above. In the technique disclosed in the '887 application, the sSOI material is formed by first creating a buried porous layer underneath a strained semiconductor layer. The porous layer is then converted into a buried oxide layer by employing a high temperature oxidation/anneal step such that only a part of the strained semiconductor layer is consumed during processing.

SUMMARY OF THE INVENTION

One aspect of the present invention relates to methods for fabricating an sSOI material that overcome all of the drawbacks mentioned above with the prior art techniques of fabricating such materials. More particularly, the present invention provides methods of fabricating an sSOI material in which a single substrate and a separation by ion implantation of oxygen (SIMOX) process are used, thereby reducing the manufacturing cost of fabricating sSOI materials, while avoiding wafer bonding and amorphization.

In one embodiment of the present invention, a tensile strained semiconductor layer, e.g., Si, is grown epitaxially on a graded semiconductor buffer layer, which was grown epitaxially on a semiconductor substrate. In accordance with this embodiment of the present invention, the graded semiconductor buffer layer has a larger in-plane lattice constant than that of the tensile strained semiconductor layer that is formed thereon. Typically, a graded SiGe buffer layer is used and the Ge composition in the buffer layer may vary from about 10 to about 35%. Epitaxial growth of the strained semiconductor and graded semiconductor buffer layers uses methods described in the prior art. The present invention exploits the fact that strain in the semiconductor layer remains nearly unchanged even for thicknesses which are five to ten times that of its critical thickness so long as the growth temperature of the semiconductor layer is kept low (on the order of less than 700° C.). For example, for a strain value of 0.8%, the critical Si thickness to form defects is approximately 150 Å. Above this thickness, generation of defects and relaxation of Si is expected. However, it has been experimentally verified by XRD and Raman measurements that strain of less than 0.7% is maintained in the Si layer, even for a thickness of approximately 1500 Å (i.e., ten times the critical thickness). The availability of a thick strain-semiconductor layer allows one to form an sSOI material in an analogous manner as SOI by using only one wafer using a separation by ion implantation of oxygen (SIMOX) method.

In general terms, the method of the present invention for fabricating a tensile strained sSOI material includes:

forming a metastable, tensile strained semiconductor material beyond its critical thickness on a surface of a graded semiconductor buffer layer, said graded semiconductor buffer layer having a larger in-plane lattice constant than said tensile strained semiconductor material;

implanting oxygen ions into at least said tensile strained semiconductor material to form a structure including an oxygen ion enriched region therein; and annealing said structure to convert said oxygen ion enriched region into a buried oxide region.

This embodiment of the present invention provides an sSOI material that includes:

a semiconductor substrate;

a graded semiconductor buffer layer located on said semiconductor substrate;

a buried oxide layer located on said graded semiconductor buffer layer; and a tensile strained semiconductor layer located on said buried oxide layer.

In another embodiment of the present invention, a compressive sSOI material is fabricated. In this particular embodiment, the general process described above for the tensile case can be used to form a compressive sSOI material so long as the starting thickness of the strained semiconductor layer is in a compressive state. In general terms, this embodiment of the present invention comprises:

forming a doped semiconductor layer beyond its critical thickness on a surface of a semiconductor substrate, said doped semiconductor layer having a lattice parameter that is less than an undoped semiconductor layer;

implanting oxygen ions into at least said doped semiconductor layer to form a structure including an oxygen ion enriched therein; and annealing said structure to convert said oxygen ion enriched region into a buried oxide region.

Optionally, a compressively strained semiconductor layer can be formed atop the doped semiconductor layer prior to implanting.

This embodiment of the present invention provides an sSOI material that includes:

a semiconductor substrate;

a doped semiconductor layer on said semiconductor substrate;

a buried oxide layer located on said doped semiconductor layer; and a compressive strained semiconductor layer, with or without dopants, located on said buried oxide layer.

Another aspect of the present invention relates to a method of creating a highly strained semiconductor layer that is thermodynamically stable from a highly metastable semiconductor layer. In accordance with this aspect of the present invention, the method includes:

forming a metastable semiconductor layer on a Si-containing substrate; and creating a damaged region within said metastable semiconductor layer which divides said metastable semiconductor layer into an upper region and a lower region, said upper region having a thickness that is below a critical thickness thereby forming a thermodynamically stable semiconductor region atop said damaged region.

DETAILED DESCRIPTION OF THE INVENTION

Figure 1A:
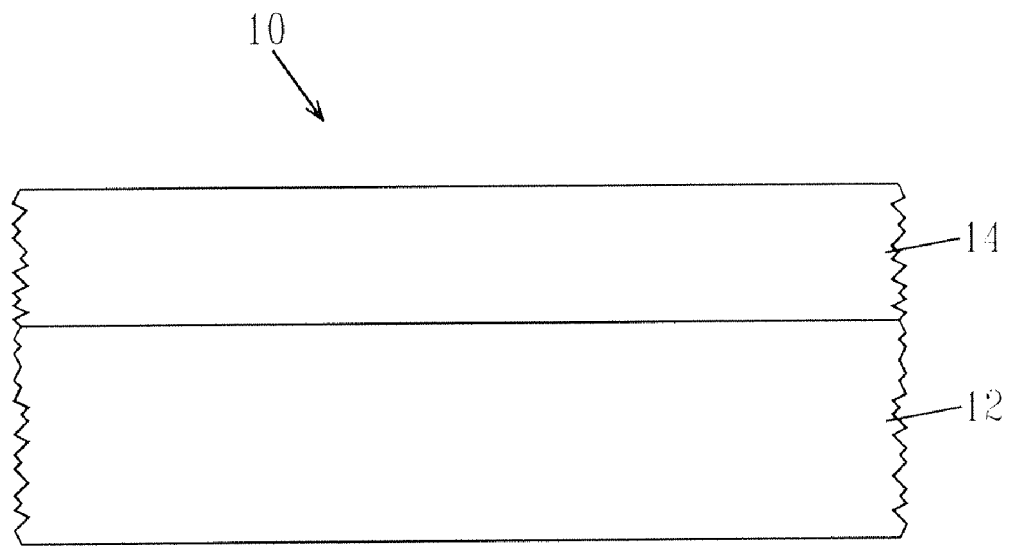
FIGS. 1A-1E are pictorial representations (through cross sectional views) depicting one embodiment of the present invention for fabricating a strained semiconductor-on-insulator (sSOI) material.

The present invention, which provides methods of fabricating strained semiconductor-on-insulator (sSOI) materials and the sSOI materials produced by the methods, will now be described in greater detail by referring to the drawings that accompany the present application. The drawings are provided for illustrative purposes only and, as such, they are not drawn to scale. In the drawings, like and corresponding elements are referred to by like reference numerals. It should be noted that throughout the present application the terms "layers" and "regions" can be interchangeable used.

As indicated above, the present invention provides a method of fabricating a tensile strained SOI material and a method of fabricating a compressive strained SOI material utilizing a single semiconductor wafer and a SIMOX process.

Reference is first made to FIGS. 1A-1E which are cross sectional views depicting the tensile strained SOI material of the present invention through various processing steps. Specifically, FIG. 1A shows an initial structure 10 that is employed in this embodiment of the present invention. The initial structure 10 includes a semiconductor substrate 12 having a graded semiconductor buffer layer 14 thereon.

The semiconductor substrate 12 employed in the present invention comprises any semiconductor material that can withstand an annealing temperature of greater than 1250° C. Examples of such semiconductor materials include, but are not limited to: Si, SiGe, SiC, or SiGeC. The term "semiconductor substrate" also includes preformed silicon-on-insulator (SOI) or SiGe-on-insulator (SGOI) substrates which may include any number of buried insulating (continuous, non-continuous or a combination of continuous and non-continuous) regions therein. In one preferred embodiment, the substrate 12 is a Si-containing substrate. The substrate 12 may be undoped or it may be an electron rich or hole-rich substrate, i.e., doped substrates.

The graded semiconductor buffer layer 14 is then formed on a surface of semiconductor 12 utilizing an epitaxial growth process. Examples of various epitaxial growth processes that can be employed in the present invention in fabricating layer 14 on the semiconductor substrate 12 include, for example, rapid thermal chemical vapor deposition (RTCVD), reduced pressure chemical vapor deposition (RPCVD), low-energy plasma deposition (LEPD), ultra-high vacuum chemical vapor deposition (UHVCVD), atmospheric pressure chemical vapor deposition (APCVD) and molecular beam epitaxy (MBE).

Since epitaxy is used in forming the graded semiconductor buffer layer 14, that layer has the same crystallographic orientation as the substrate 12. The graded semiconductor buffer layer 14 is typically a compound semiconductor material in which one of the elements thereof is present in the layer in a varying content. In accordance with the present invention, the graded semiconductor buffer layer 14 has an in-plane lattice constant that is larger than the strained semiconductor layer 16 to be subsequently formed thereon. Examples of such compound semiconductors include Si or a Si-containing semiconductor. Preferably, the graded semiconductor buffer layer 14 is a SiGe alloy layer. The term "SiGe alloy layer" denotes a SiGe layer that comprises greater than 5 atomic %, preferably greater than 15 atomic %, Ge. Typically, the Ge content in the SiGe alloy layer varies from 10 to 35 atomic %.

In accordance with the present invention, the graded semiconductor buffer layer 14 is a low defect layer that is formed by epitaxy. The term "low defect" denotes a graded semiconductor buffer layer having a defect (stacking faults, pile-up and threading) density typically of about $10^7$ defects/cm$^2$ or less, with a defect density of about $10^6$ defects/cm$^2$ or less being even more typical.

The graded semiconductor buffer layer 14 is typically a relaxed semiconductor material having a thickness from about 100 to about 10000 nm, with a thickness from about 500 to about 5000 nm being even more typical.

Figure 1B:
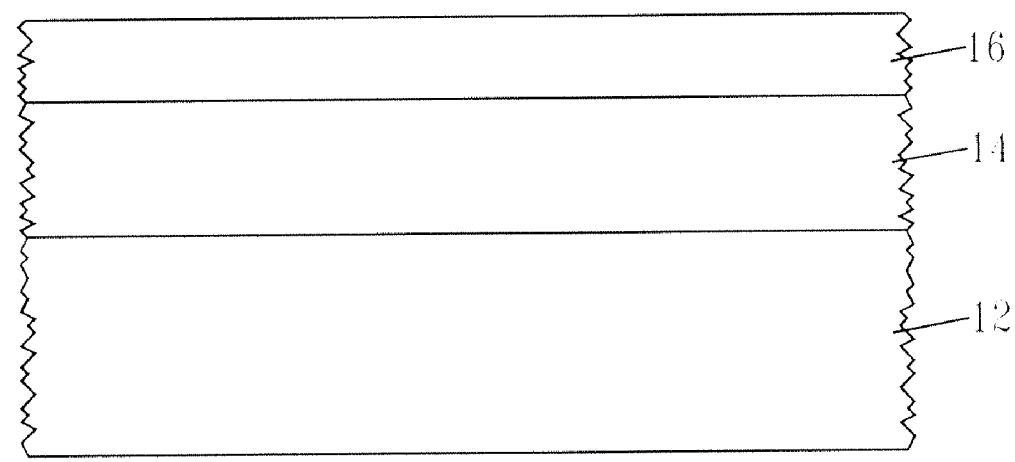

Next, and as is shown in FIG. 1B, a strained semiconductor layer 16 is formed on the surface of the graded semiconductor buffer layer 14 utilizing one of the epitaxial growth processes mentioned hereinabove in connection with forming layer 14. It is noted that the growth of layers 14 and 16 may occur using the same or different epitaxial growth process. Moreover, it is also contemplated to form layers 14 and 16 in the same reactor chamber without breaking vacuum.

In this step of the present invention, the epitaxial growth process is performed at a temperature that is typically less than 700° C., with a growth temperature of less than 650° C. being even more typical. In accordance with the present invention, the strained semiconductor layer 16 has a lower in-plane lattice constant than that of the graded semiconductor buffer layer 14 and, as such, the strained semiconductor layer 16 would be under a tensile strain when formed on the graded semiconductor buffer layer 14. The strained semiconductor layer 16 is typically Si or a Si-containing material such as, for example SiGe, SiC, or SiGeC.

In accordance with the present invention, the strained semiconductor layer 16 is grown to a thickness that is greater than its critical thickness. The term "critical thickness" is defined herein as the maximum thickness in which the semiconductor layer can be grown without generation of defects and where relaxation of the semiconductor layer is expected to occur. As such, the strained semiconductor layer 16 has a defect density similar to that of the buffer layer 14 (on the order of about $10^7$ defects/cm$^2$ or less) and is metastable. By "metastable" it is meant that the combination of thickness and strain of layer 16 is such that strain-relieving dislocations are energetically preferred to exist within the layer, but growth is performed under conditions, which inhibit the introduction of dislocations (clean surfaces and low-temperature growth). This embodiment of the present invention exploits the fact that strain in a semiconductor material remains nearly unchanged even for thicknesses which are much, much (i.e., 5× to 10×) of its critical thickness so long as the growth temperature is maintained within the ranges mentioned above.

In accordance with the present invention, the strained semiconductor layer 16 has a strain value of about 0.01% or greater, with a strain value of about 0.1% or greater being even more typical. Typically, the strained semiconductor layer has a thickness that is greater than 50 Å, with a thickness of greater than 500 Å being more typical.

Figure 1C:
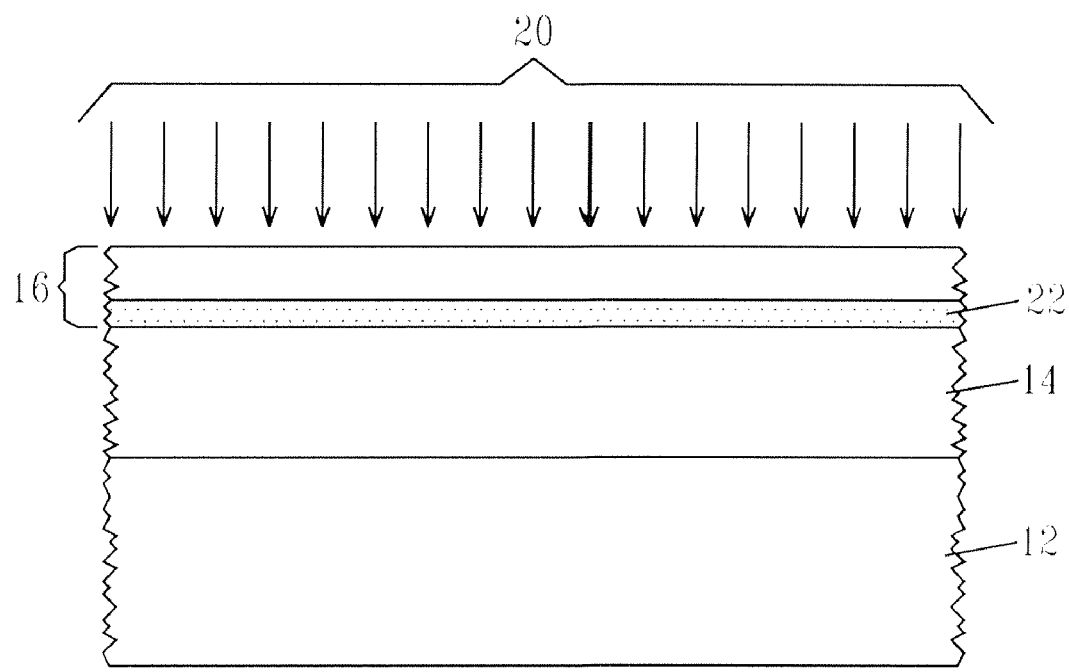

FIG. 1C shows the structure during the implantation of oxygen ions 20 into the structure shown in FIG. 1B forming oxygen ion enriched region 22 within the structure. The ions 12 are implanted totally into the strained semiconductor layer 16 (as shown) or partially into the strained semiconductor layer 16 and the underlying graded semiconductor buffer layer 14 (typically at or near the interface between these two layers).

The oxygen ions 20 are implanted in a sufficient concentration that forms an implant rich region, i.e., oxygen ion enriched region, 22 in the structure. The oxygen ion enriched region 22 formed at this point of the present invention has an ion concentration that is sufficient to form a buried oxide when subjected to a subsequent annealing step. Typically, the oxygen ion enriched region 22 formed in this step of the present invention has an oxygen ion concentration of about $1\times10^{21}$ atoms/cm$^3$ or greater.

The oxygen ions 20 are implanted using conventional SIMOX processes and conditions that are well known to those skilled in the art, as well as the various SIMOX processes and conditions mentioned in co-assigned U.S. patent application Ser. No. 09/884,670, filed Jun. 19, 2001 as well as U.S. Pat. Nos. 5,930,634 to Sadana, et al., 6,486,037 to Norcott, et al., 6,541,356 to Fogel, et al., 6,602,757 to Hovel, et al., and 6,846,727 to Fogel, et al. The entire contents of each are being incorporated herein by reference. The implant may be a blanket implant as shown in FIG. 1A or a patterned implant may be employed. The patterned implant may include a dielectric mask formed directly on the upper surface of the strained semiconductor layer or a mask that is located some distance from the upper surface of the strained semiconductor layer may be employed.

Although various implant conditions can be employed in the present invention, the following provides general implant conditions for forming an oxygen ion enriched region 22 within the structure shown in FIG. 1B: An oxygen ion implantation dose of greater than 1E16 cm$^2$, with an oxygen ion dosage of greater than 1E17 cm$^{-2}$ being more preferred for a strained semiconductor layer greater than 500 Å. In addition to using such dosages, this implant is typically carried out in an ion implantation apparatus that operates at a beam current density of greater than 0.05 milliamps cm$^{-2}$ and at an energy of greater than 20 keV, with an energy of greater than 50 keV being even more preferred. This implant, which may be performed in a single step or multiple steps, is carried out at a temperature of greater than 200° C., with an implantation temperature of greater than 350° C. being even more preferred. It is again emphasized that the above types of implant conditions are exemplary and by no way limit the scope of the present invention. Instead, the present invention contemplates all conventional ion implants that are typically employed in conventional SIMOX processes.

After providing the oxygen ion enriched region 22 within the structure, the structure shown in FIG. 1C is then annealed at a temperature which coverts region 22 into a buried oxide region 24. The buried oxide region or layer 24 formed during the annealing step of the present invention has a thickness of about 500 nm or less, with a thickness of from about 50 to about 200 nm being more highly preferred. Note that the buried oxide 24 is a thermal oxide which is of higher electrical quality as compared to non-thermal oxides that are formed by wafer bonding and layer transfer techniques.

Figure 1D:
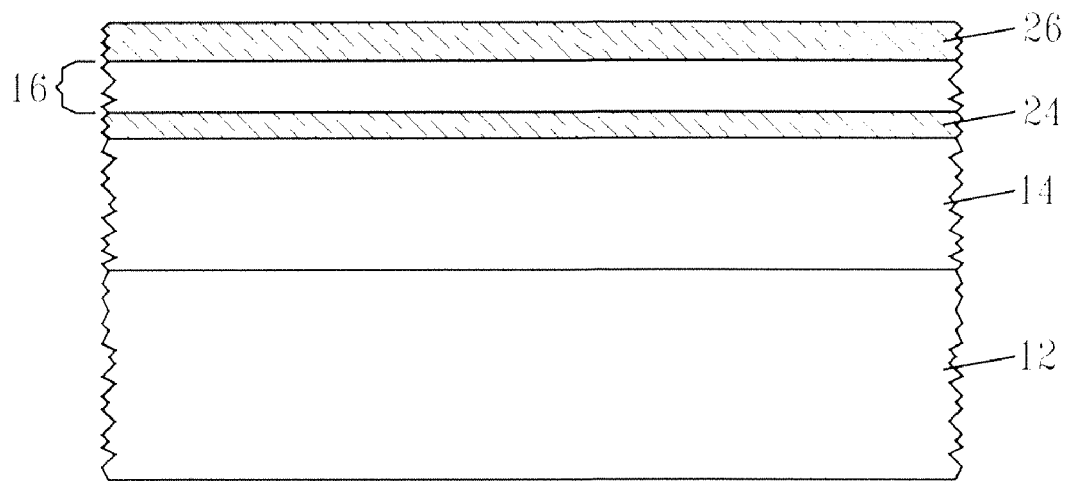
Figure 1E:
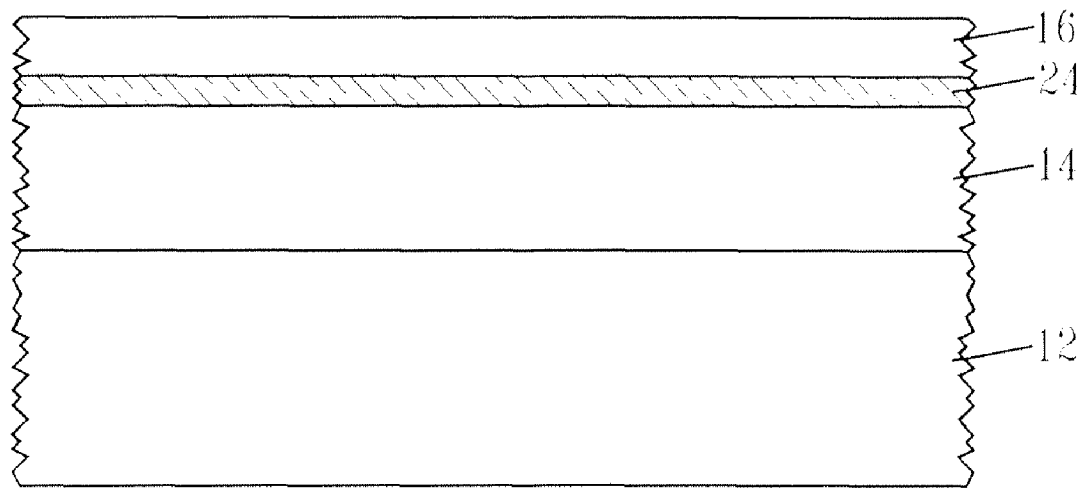

FIG. 1D shows the resultant structure that is formed after the annealing step of the present invention has been performed. Note that a surface oxide layer 26, as is also shown in FIG. 1D, is formed atop the strained semiconductor layer 16 during this annealing step. This surface oxide layer is typically, but not always, removed from the structure after the annealing step using a conventional wet etch process wherein a chemical etchant such as HF that has a high selectivity for removing oxide as compared to the underlying strained semiconductor layer 16 is employed. FIG. 1E shows the sSOI material after removing the surface oxide 26 from atop the strained semiconductor layer 16. The surface oxide layer 26 formed has a variable thickness which may range from about 10 to about 1000 nm, with a thickness of from about 20 to about 500 nm being more highly preferred.

Specifically, the annealing step of the present invention is performed at a high temperature of about 1250° C. or greater, with a temperature of about 1300° C. or greater being more highly preferred. Moreover, the annealing step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. In embodiment of the present invention, the annealing is performed in an inert ambient mixed with less than 5% oxygen. Other ranges for the oxygen content are also contemplated herein.

The annealing step may be carried out for a variable period of time that typically ranges from about 10 minutes or greater, with a time period from about 60 minutes or greater being more highly preferred. The heating step may be carried out at a single targeted temperature, or various ramp and soak cycles using various ramp rates and soak times can be employed.

The resultant structure after annealing and removal of the surface oxide 26 is shown in FIG. 1E. The structure includes semiconductor substrate 12, a graded semiconductor buffer layer 14 located on the semiconductor substrate 12, a buried oxide layer 24 located on the graded semiconductor buffer layer 14, and a semiconductor layer 16 under tensile strain located on the buried oxide layer 24. In some embodiments in which the graded semiconductor buffer layer 14 includes SiGe, a small Ge content (equal to or less than the underlying buffer layer; typically, this value is less than 5 atomic % Ge) may be present in the strained semiconductor layer 16.

Reference is now made to FIGS. 2A-2E which illustrates a second embodiment of the present invention. In the second embodiment, a doped semiconductor layer 30 (partially or fully relaxed) is formed on a semiconductor substrate 12 providing the structure shown, for example, in FIG. 2A. In accordance with this aspect of the present invention, the doped semiconductor layer 30 has a lattice constant that is lower than an undoped semiconductor material. The semiconductor substrate 12 includes one of the above-mentioned materials.

The doped semiconductor layer 30 may include C dopants, B dopants or a combination thereof, with B dopants being highly preferred. It is noted that the doped semiconductor layer 30 may have a continuous or gradient distribution of said dopants therein. The term "semiconductor" when used in content with layer 30 denotes any semiconductor material including, for example, Si and SiGe Preferably, the doped semiconductor layer 30 is B-doped Si.

In accordance with the present invention, the doped semiconductor layer 30 is a layer that is more heavily doped than the underlying substrate 12. Typically, the doped semiconductor layer 30 contains at least one of B or C (or used in conjunction) in a concentration of greater than 1E19 atoms/$cm^3$, with a dopant concentration of greater than 1E20 atoms/$cm^3$ being more typical. The doped semiconductor layer 30 is formed using one of the above mentioned epitaxial growth processes in which the dopant source is included with the semiconductor source.

The doped semiconductor layer 30 is a partially or fully relaxed buffer layer with a lattice parameter less than that of undoped silicon. It is grown such that the defect density is on the order of about $10^7$ defects/$cm^2$ or less. Typically, the doped semiconductor layer 30 has a thickness of greater than 1000 Å, with a thickness of greater than 5000 Å being more typical.

After forming the doped semiconductor layer 30, a strained semiconductor layer 32 is optionally formed on top of the doped semiconductor layer 30 using one of the above-mentioned epitaxial growth processes. This structure is shown, for example, in FIG. 2B. The strained semiconductor layer 32 may be comprised of one of the semiconductor materials mentioned above in connection with layer 16. The strained semiconductor layer 32 and the doped semiconductor layer 30 can thus be comprised of the same or different semiconductor material. The strained semiconductor layer 32 typically has a compressive stress in this embodiment of the present invention. The optional strained semiconductor layer 30 has a thickness of less than 5000 Å, with a thickness of less than 2000 Å being more typical.

It is noted that the growth of layers 30 and 32, if present, may occur using the same or different epitaxial growth process. Moreover, it is also contemplated to form layers 30 and 32 in the same reactor chamber without breaking vacuum.

The optional strained semiconductor layer 32 may be doped or undoped. When doped, the optional strained semiconductor layer 32 typically has a dopant concentration of about 1E15 atoms/$cm^3$ or greater.

In one embodiment of the present invention, the optional strained semiconductor layer 32 and the doped semiconductor layer 30 are comprised of the same or different Si-containing semiconductor, with Si or SiGe being highly preferred.

For clarity the following structures depict the optional strained semiconductor layer 32 as not being present. Although such an embodiment is illustrated and described hereinbelow, the following processing steps work equally well when the optional strained semiconductor layer 32 is present atop the doped semiconductor layer. In embodiments in which the optional strained semiconductor layer 32 is present, the buried oxide could be formed between layers 32 and 30, or between layers 30 and 12.

Figure 2A:
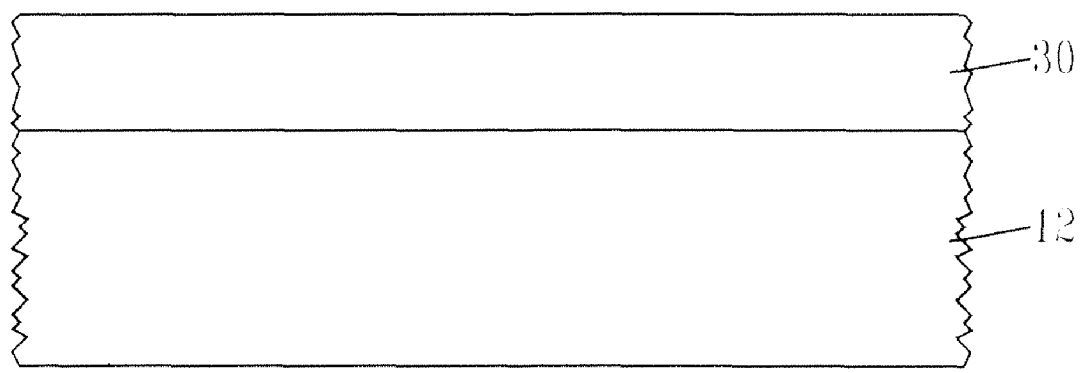
FIGS. 2A-2E are pictorial representations (through cross sectional views) depicting another embodiment of the present invention for fabricating an sSOI material.
Figure 2B:
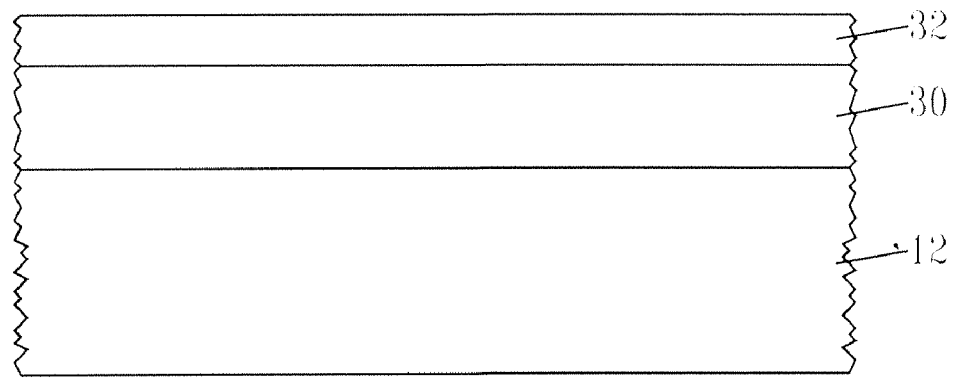
Figure 2C:
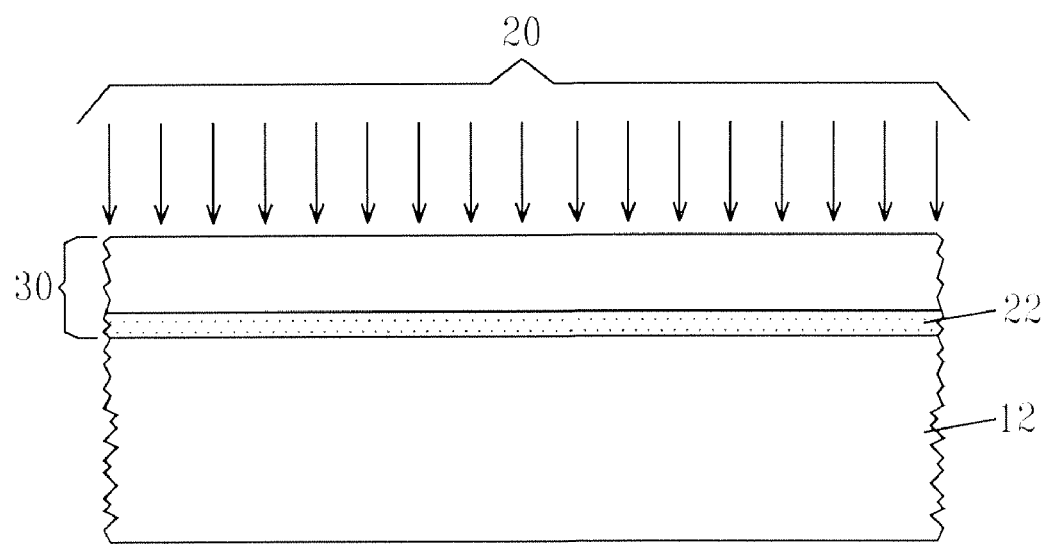

FIG. 2C shows the structure of FIG. 2A after forming oxygen ion enriched region 22 into at least a portion of the doped semiconductor layer 30 utilizing the ion implantation process described above. In this drawing, reference numeral 20 denotes the oxygen ions being implanted.

Figure 2D:
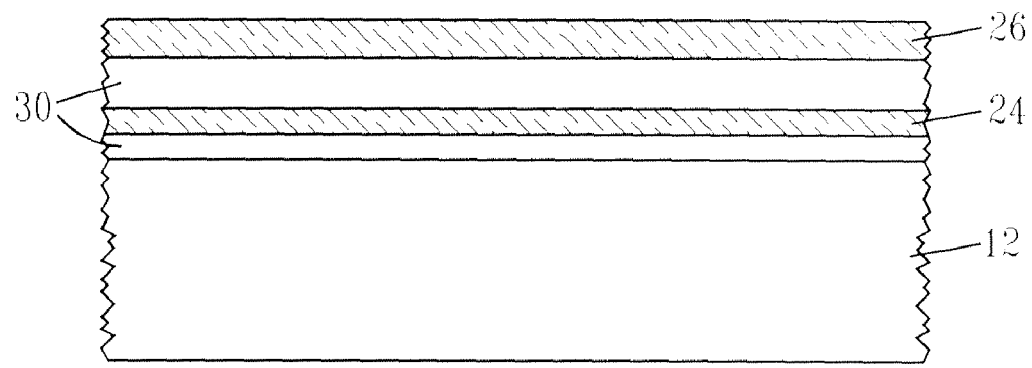
Figure 2E:
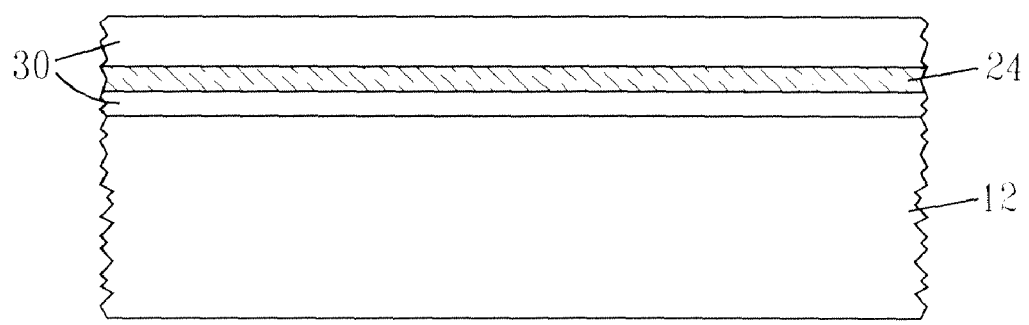

FIG. 2D shows the structure of FIG. 2C after subjecting the same to the annealing process mentioned above. In this drawing, reference numeral 24 denotes the buried oxide layer, while reference numeral 26 denotes the surface oxide layer. FIG. 2E illustrates the structure after removing the surface oxide 26 from the structure.

After annealing, and subsequent removal of the surface oxide layer 26, the structure shown in FIG. 2E can be subjected to a thermal process (i.e., baking step) that is capable of reducing the content of B or C dopants present in the final structure. The baking step is typically performed in the presence of a hydrogen-containing ambient such as $H_2$ for boron doped materials. An oxygen ambient can be used in removing C from C doped materials. Leaching of dopants, e.g., B or C, from the structure typically occurs when this step is performed at a temperature that is greater than 800° C., with a temperature of greater than 1000° C. being more typical. This thermal step is optional and does not need to be performed in all instances. Leaching of dopants using the thermal treatment process can be performed for any desired period of time.

Typically, the thermal process, which leaches dopants from the structure, is performed for a time period from about 1 to about 60 minutes. As stated above, this baking step reduces the amount of dopant within the SSOI substrate. Although it can be used to reduce any dopant within the SSOI substrate, it is particularly employed to remove boron from the structure.

Figure 3A:
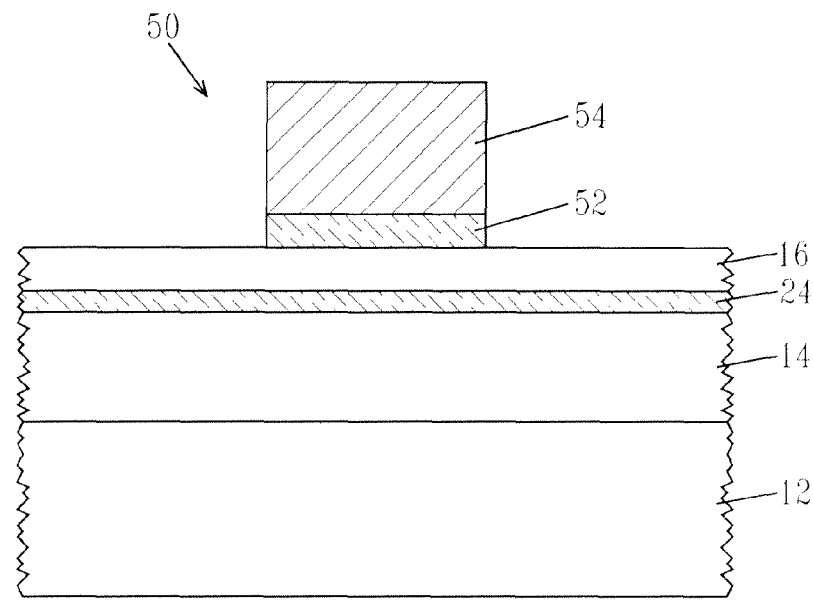
FIGS. 3A-3B are pictorial representations (through cross sectional views) depicting a FET formed on the inventive structure shown in FIG. 1E and FIG. 2E, respectively.
Figure 3B:
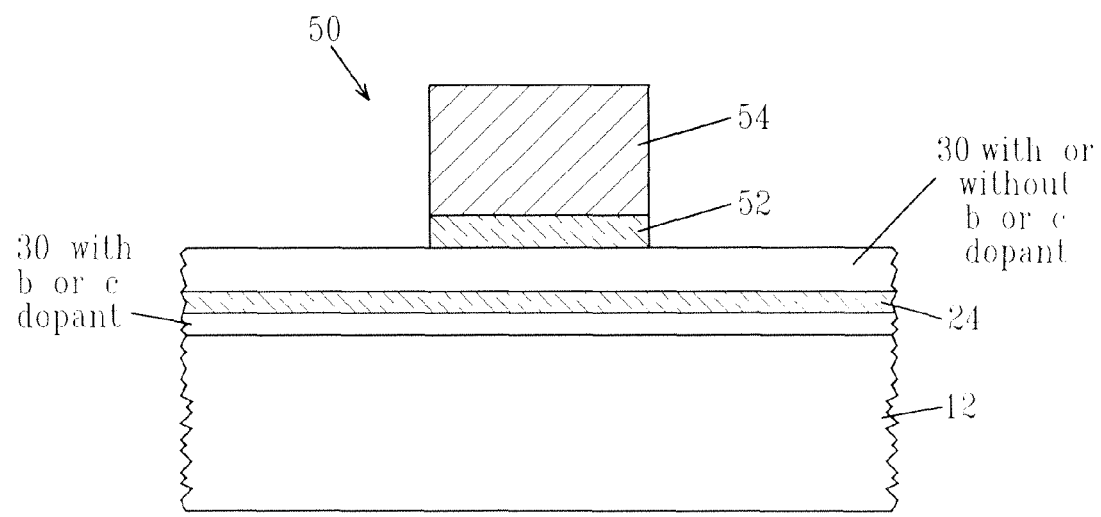

After performing the above processing steps, conventional CMOS process can be carried out to form one or more CMOS devices such as field effect transistors (FETs) atop the strained semiconductor layer. FETs 50 located on the inventive sSOI material shown in FIGS. 1E and 2E are shown in FIGS. 3A and 3B, respectively. The CMOS processing is well known to those skilled in the art; therefore details concerning that processing are not needed herein. Each FET 50 includes a patterned stack comprised of a gate dielectric 52 material and at least one gate conductor 54. It is noted that the present invention is not limited to forming FETs. Instead, other semiconductor devices including, but not limited to: bipolar transistors, capacitors, diodes, memory cells, etc. can be formed alone, or in conjunction with each other. The remaining description describes the elements of a typical FET.

The gate dielectric material is a dielectric that has a dielectric constant that is equal to, or preferably greater than, that of silicon dioxide. When dielectric materials having a dielectric constant that is greater than silicon dioxide are used, the dielectric material typically comprises any metal oxide or mixed metal oxide that is typically used as a gate dielectric or a capacitor dielectric in semiconductor device manufacturing. Examples of such dielectric materials (which can be referred to as a high k dielectric since they have a dielectric constant of that which is greater than silicon dioxide) include, but are not limited to: $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based dielectrics (to be described in greater detail herein below), and combinations including multilayers thereof.

The term 'Hf-based dielectric' is intended herein to include any high k dielectric containing hafnium, Hf. Examples of such Hf-based dielectrics comprise hafnium oxide ($HfO_2$), hafnium silicate ($HfSiO_x$), Hf silicon oxynitride (HfSiON), $HfLaO_x$, $HfLaSiO_x$, $HfLaSiON_x$ or multilayers thereof. Typically, the Hf-based dielectric is hafnium oxide or hafnium silicate. Hf-based dielectrics typically have a dielectric constant that is greater than about 10.0.

The physical thickness of the gate dielectric material may vary, but typically, the gate dielectric material has a thickness from about 0.2 to about 20 nm, with a thickness from about 0.5 to about 10 nm being more typical. The gate dielectric material may be formed in-situ or ex-situ utilizing any conventional deposition process including, for example, chemical vapor deposition, PECVD, atomic layer deposition, chemical solution deposition, MOCVD, MBE, evaporation and other like deposition processes.

The at least one gate conductor is formed utilizing a known deposition process such as, for example, physical vapor deposition, CVD or evaporation. The conductive material used as the gate conductor includes, but is not limited to: Si-containing materials such as Si or a SiGe alloy layer in either single crystal, polycrystalline or amorphous form. The conductive material may also be a conductive metal or a conductive metal alloy. Combinations of the aforementioned conductive materials are also contemplated herein. Si-containing materials are preferred, with polySi being most preferred. In addition to aforementioned conductive materials, the present invention also contemplates instances wherein the conductor is fully silicided or a stack including a combination of a silicide and Si or SiGe. The silicide is made using a conventional silicidation process well known to those skilled in the art. Fully silicided layers can be formed using a conventional replacement gate process; the details of which are not critical to the practice of the present invention. The blanket layer of conductive material may be doped or undoped prior to patterning. If doped, an in-situ doping deposition process may be employed in forming the same. Alternatively, a doped conductive material can be formed by deposition, ion implantation and annealing. The ion implantation and annealing can occur prior to or after a subsequent etching step that patterns the material stack. The doping of the conductive material will shift the workfunction of the electrode formed. The thickness, i.e., height, of the gate conductor deposited at this point of the present invention may vary depending on the deposition process employed. Typically, the gate conductor has a vertical thickness from about 20 to about 180 nm, with a thickness from about 40 to about 150 nm being more typical.

Each FET 50 may also include least one spacer that is typically, but not always, formed on exposed sidewalls of each patterned material stack. The at least one spacer is comprised of an insulator such as an oxide, nitride, oxynitride and/or any combination thereof. The at least one spacer is formed by deposition and etching. The width of the at least one spacer must be sufficiently wide such that the source and drain silicide contacts (to be subsequently formed) do not encroach underneath the edges of the patterned material stack. Typically, the source/drain silicide does not encroach underneath the edges of the patterned material stack when the at least one spacer has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions are then formed into the strained semiconductor layer. The source/drain diffusion regions are formed utilizing ion implantation and an annealing step. Typically, a raised source/drain process is used. The annealing step serves to activate the dopants that were implanted by the previous implant step. The conditions for the ion implantation and annealing are well known to those skilled in the art. The source/drain diffusion regions may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, an annealing step as described above can be performed. Further CMOS processing such as formation of silicided contacts (source/drain and gate) as well as formation of BEOL (back-end-of-the-line) interconnect levels with metal interconnects can be formed utilizing processing steps that are well known to those skilled in the art.

While the present invention has been particularly shown and described with respect to preferred embodiments thereof, it will be understood by those skilled in the art that the foregoing and other changes in forms and details may be made without departing from the scope and the spirit of the present invention. It is therefore intended that the present invention not be limited to the exact forms and details described and illustrated, but fall within the scope of the appended claims.

What is claimed is:

1. A method of fabricating a strained semiconductor-on-insulator (sSOI) material comprising:
    forming a doped semiconductor layer beyond its critical thickness on a surface of a semiconductor substrate, said doped semiconductor layer having a lower lattice constant than an undoped semiconductor material;
    forming a compressively strained semiconductor layer on the doped semiconductor layer, wherein the compressively strained semiconductor layer provides an upper semiconductor surface;
    implanting oxygen ions into at least said doped semiconductor layer to form a structure including an oxygen ion enriched region therein;
    annealing said structure to convert said oxygen ion enriched region into a buried oxide region; and
    forming at least one FET on said upper semiconductor surface that lies above said buried oxide region, said at least one FET comprises at least a gate dielectric material in direct contact with the upper semiconductor surface and a gate conductor.

2. The method of claim 1 wherein said doped semiconductor layer comprises B-doped Si, C-doped Si or B and C-doped Si.

3. The method of claim 1 wherein said implanting comprises an oxygen dosage of greater than 1E16 atoms/cm$^2$, an implant energy of greater than 20 keV, and an implant temperature of greater than 200° C.

4. The method of claim 1 wherein said annealing is performed at a temperature of about 1250° C. or greater in an oxidizing ambient including at least one oxygen-containing gas.

5. The method of claim 1 wherein said annealing provides a surface oxide atop the doped semiconductor material.

6. The method of claim 1 further comprising performing a thermal process which removes dopant from said doped semiconductor layer that is located above said buried oxide region.

7. The method of claim 6 wherein said thermal process comprises baking in a hydrogen-containing ambient or an oxygen-containing ambient at a temperature that is greater than 800° C.

* * * * *